United States Patent [19]
Watson

[11] Patent Number: 5,352,940
[45] Date of Patent: Oct. 4, 1994

[54] RAM CONVERTIBLE LOOK-UP TABLE BASED MACROCELL FOR PLDS

[75] Inventor: James Watson, Santa Clara, Calif.

[73] Assignee: Altera Corporation, San Jose, Calif.

[21] Appl. No.: 68,368

[22] Filed: May 27, 1993

[51] Int. Cl.⁵ .......................................... H03K 19/173
[52] U.S. Cl. ................................... 307/465; 307/468; 365/189.08; 365/230.06
[58] Field of Search ..................... 307/465–469, 307/189.08, 230.06

[56] References Cited

U.S. PATENT DOCUMENTS

| | | | |
|---|---|---|---|
| 4,831,573 | 5/1989 | Norman | 307/465 |
| 5,128,559 | 7/1992 | Steele | 307/465 |
| 5,136,188 | 4/1992 | Ha | 307/465 |
| 5,258,668 | 11/1993 | Cliff | 307/465 |
| 5,260,610 | 11/1993 | Pederson | 307/465 |
| 5,282,163 | 1/1994 | Shibata | 365/189.08 |

Primary Examiner—Edward P. Westin
Assistant Examiner—Andrew Sanders
Attorney, Agent, or Firm—Townsend and Townsend Khourie and Crew

[57] ABSTRACT

A macrocell for use in programmable logic devices (PLDs) that provides for standard memory functions with minimum overhead circuitry. In a PLD that uses static random access memory (SRAM) as its configuration host, the circuit of the present invention enables the SRAM to be programmed via bidirectional look-up tables. In a user mode, macrocell bidirectional look-up table implements the configured logic, while in supervisor and memory modes the look-up table acts as an address decoder for the SRAM. A tristate buffer and two pass gates to direct data out of, and drive data into, the SRAM cells through the look-up table are the only additional circuitry required.

14 Claims, 2 Drawing Sheets

RAM CONVERTIBLE LOOK-UP TABLE BASED MACROCELL FOR PLDS

BACKGROUND OF THE INVENTION

The present invention relates generally to a logic module or macrocell for use in programmable logic devices (PLDs). More particularly, this invention relates to a look-up table based macrocell capable of functioning as a standard memory unit.

The fundamental building block of a PLD is a macrocell. Each macrocell is capable of performing basic "sum of products" logic on a number of input variables. When combined together in large numbers inside a PLD, they facilitate implementation of complex combinatorial as well as sequential logic.

One approach to implementing a macrocell utilizes a programmable memory structure that includes architecture bits for storing information corresponding to a desired logic configuration. The memory structure is then connected to a look-up table that, based on a logical combination of its several inputs, produces a selected bit from the memory structure at an output. To be able to perform sequential logic, the output of the look-up table also feeds an input of a configurable register. A macrocell thus constructed offers advantages in speed, density, programming flexibility, and manufacturing ease.

The programming element in such a macrocell can be implemented in a variety of technologies: fusible links, mask or electrically programmable read-only memory cells, or static random access memory (SRAM) cells. The complexity of the required programming circuitry varies with the type of memory technology used. For example, in the case of a PLD that uses SRAM technology as the logic configuration host, at a minimum, address decoding logic is required to load the programming data into the memory cells. This overhead programming circuitry adds to the size and cost of the integrated circuit.

Moreover, PLD's using look-up table based macrocells are designed such that the SRAM configuration bits are used to perform macrocell logic and control functions only. Therefore, for those applications where it is desirable to add standard memory functions to a PLD, independent memory cells in a separate memory structure are added to the PLD architecture. The added memory circuitry further increases the size and complexity, and therefore the cost of the integrated circuit.

From the foregoing, it can be appreciated that there is a need for a look-up table based macrocell with reduced programming overhead circuitry that also provides for standard memory functions without increasing circuit complexity and size.

SUMMARY OF THE INVENTION

The present invention offers a look-up table based macrocell with reduced programming overhead circuitry that is also capable of functioning as standard memory with minimum additional circuitry.

The macrocell of the present invention utilizes look-up table logic that implements any logical function of its several input variables. A plurality of RAM bits coupled to the look-up table define its logic function. The macrocell uses bidirectional look-up table logic, enabling the look-up table to perform address decoding during RAM programming. In a supervisor mode, the macrocell architecture bits are accessed for programming through look-up tables functioning as address decoders. Bidirectional look-up tables direct programming data into RAM cells, thereby eliminating the need for conventional memory address decoders. In a user mode, the look-up tables operate in the opposite direction, receiving and outputting data from the SRAM bits responsive to the look-up table data inputs.

Further, the macrocell of the present invention provides for a memory mode of operation by adding only a single pass gate. In the memory mode the macrocell RAM bits can be utilized for standard memory functions such as scratch pad memory.

A further understanding of the nature and advantages of present invention may be gained with reference to the description and diagrams below.

DESCRIPTION OF THE PREFERRED EMBODIMENT

Figure 1:
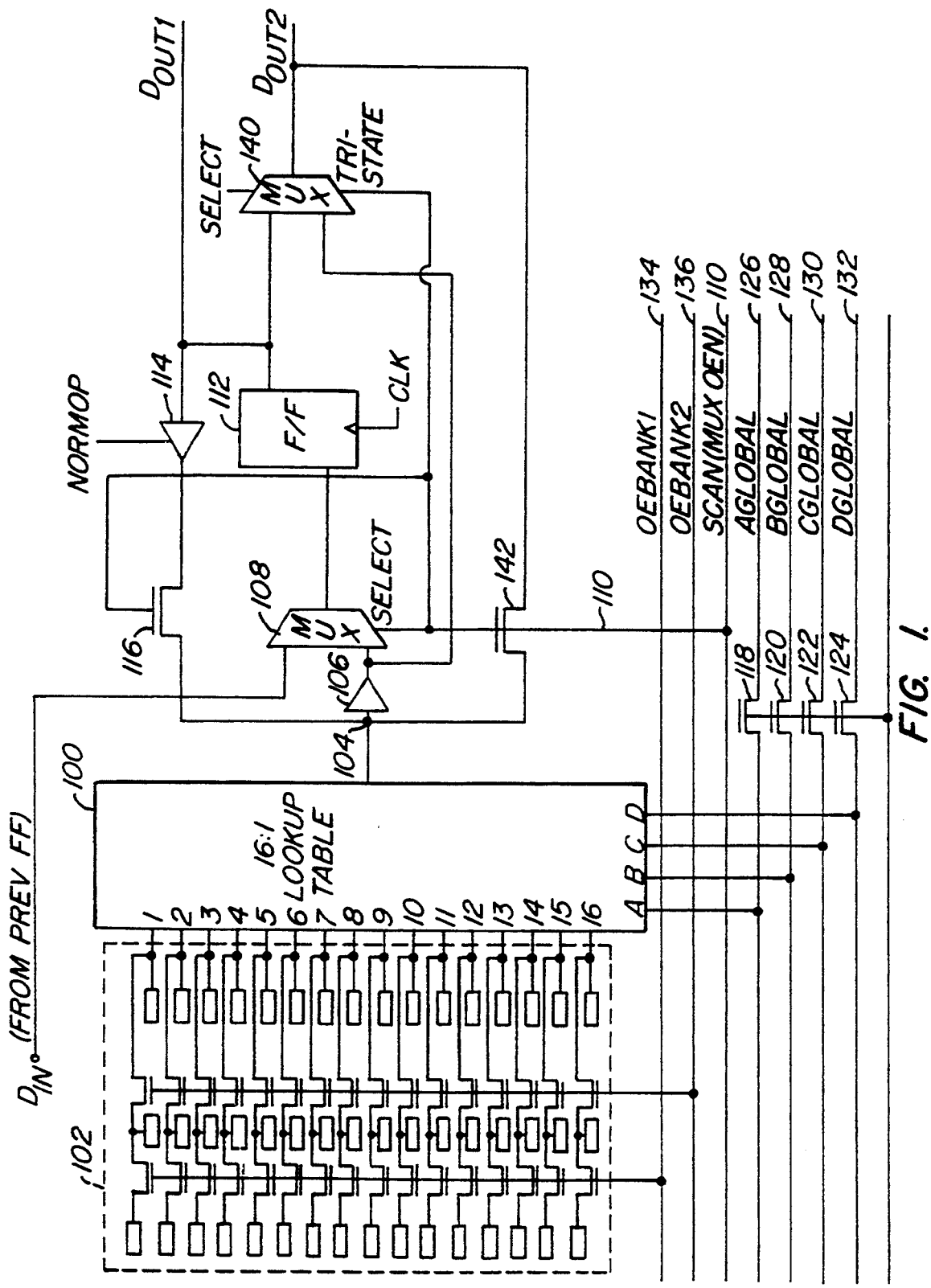
FIG. 1 is a circuit diagram of a macrocell for use in a PLD according to the present invention.

FIG. 1 is a circuit diagram of a macrocell for use in a PLD according to the present invention. It includes a four-input (16:1) bidirectional look-up table (LUT) 100 that has its 16 control terminals connected to 16 bits of an SRAM 102. LUT 100 has an input/output (I/O) terminal 104 that connects to an input of a buffer 106. An output of buffer 106 connects to one input of a 2:1 multiplexer (MUX) 108 whose second input is connected to the macrocell input $D_{in}$. The select input of MUX 108 connects to SCAN line 110, while its output drives an input of a clocked flip-flop 112. The output of flip-flop 112 and the output of buffer 106 connect to two inputs of a 2:1 MUX 140, respectively. In addition to a select input that is controlled by an architecture bit, MUX 140 includes a tristate input that is driven by SCAN line 110. The output of flip-flop 112 and the output of MUX 140 form the two outputs, $D_{out1}$ and $D_{out2}$, of the macrocell. Output of flip-flop 112 ($D_{out1}$) also feeds back to LUT 100 I/O terminal 104 through a tristate buffer 114 and a pass gate 116. A tristate input of tristate buffer 114 connects to a NORMOP signal which disables buffer 114 during normal (user mode) operation. Output of MUX 140 also feeds back to I/O terminal 104 through a pass gate 142. SCAN line 110 controls both pass gates 116 and 142. Four pass gates 118, 120, 122 and 124 connect global input lines AGLOBAL 126, BGLOBAL 128, CGLOBAL 130, and DGLOBAL 132 to the four select inputs of LUT 100, respectively. Two input lines 134 and 136 control access to two separate columns of bits in SRAM 102.

Figure 2:
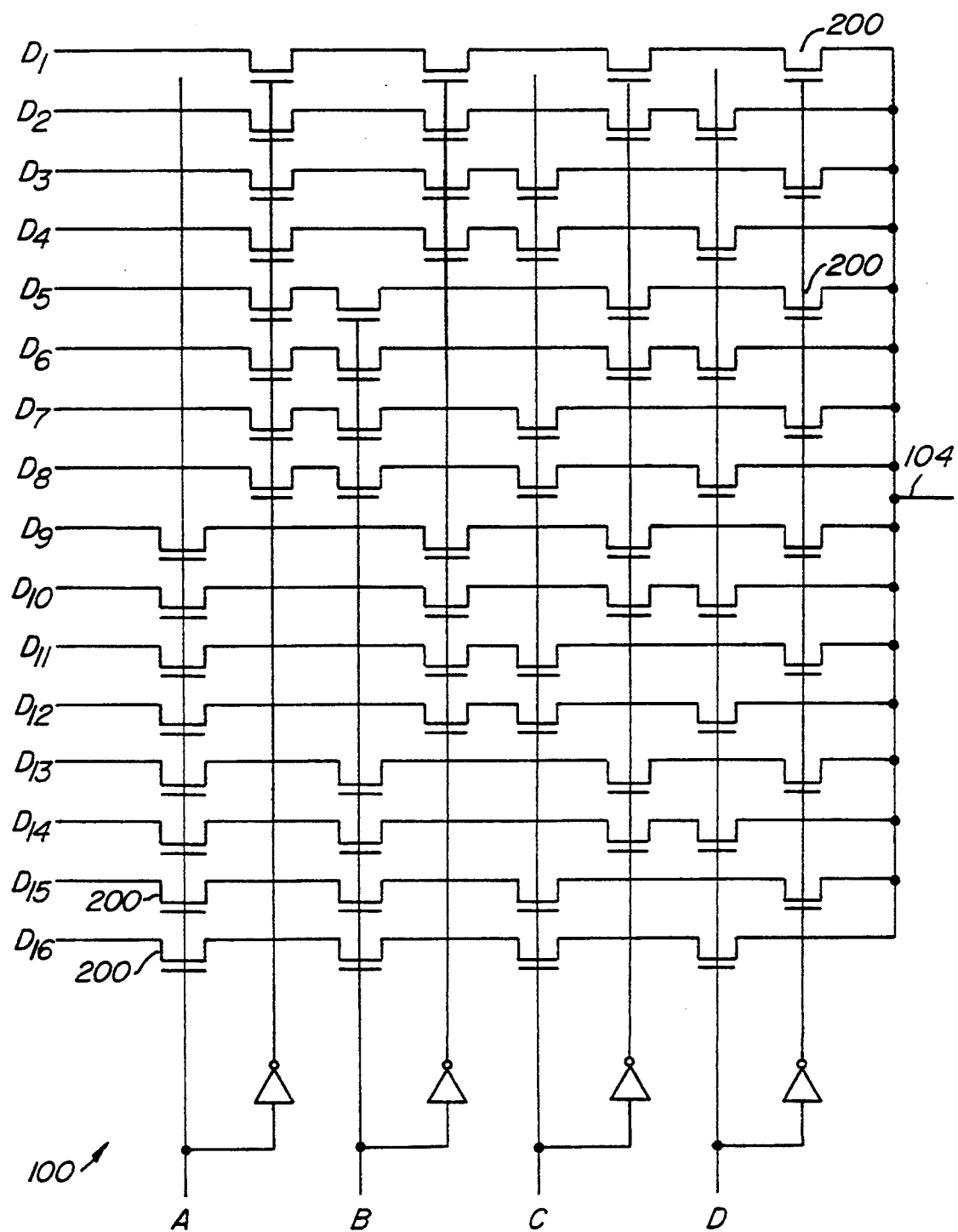
FIG. 2 is a circuit schematic of a bidirectional look-up table.

FIG. 2 shows a circuit schematic for the four-input bidirectional look-up table 100. Different combinations of true and complement of input signals A, B, C, and D are applied to 16 rows of pass gates 200 such that all 16 possible logic combinations of the four inputs are realized at the output 104. The simple pass gate architecture allows data to flow in either direction; from the output 104 to any one of the 16 terminals $D_1$–$D_{16}$, or from any one of the 16 terminals $D_1$–$D_{16}$ to output 104.

According to a preferred embodiment, the macrocell of the present invention has three modes of operation: the two conventional supervisor and user modes, and a third memory mode of operation. In the supervisor mode, the device is powered up and the configuration data that defines the macrocell logic functions is loaded onto the SRAM 102. It is in this mode that data is steered by the bidirectional LUT 100 into appropriate storage locations of SRAM 102. A typical PLD architecture includes a large number of rows of macrocells connected in series. In every row, $D_{out1}$ of each macrocell connects to $D_{in}$ of the next macrocell. The programming of the SRAM portion of the device is, therefore, accomplished by serially loading each macrocell.

In the supervisor mode, SCAN line 110 is high. A high SCAN line turns on pass gates 110 and 116, selects macrocell input $D_{in}$ to be connected to MUX 108 output, and tristates MUX 140. A scan chain is formed by connecting $D_{out1}$ to $D_{in}$ of the next macrocell. The signal NORMOP is low during the supervisor mode to enable the feedback path from $D_{out1}$ to the input of LUT 100 at node 104. A timed clock signal arrives at a clk input of flip-flop 112 to transfer the input data $D_{in}$ at MUX 108 output to LUT 100 I/O line 104 through tristate buffer 114 and switch 116. Global lines 126, 128, 130 and 132 direct the input data $D_{in}$ to the appropriate one of the 16 SRAM 102 rows. In the supervisor mode LUT 100 therefore acts as an address decoder for SRAM 102. Turning on pass gate 142 during supervisor mode does not create contention problem at node 104 because output of MUX 140 as well as chip I/O buffers (where $D_{out2}$ normally connects) are tristated during the supervisor mode.

SRAM 102 is divided into three columns of bits separated by two columns of pass gates. The first column, connecting directly to the 16 inputs of LUT 100 are the LUT configuration bits. The other two columns provide additional memory cells for storage of architectural bits that control the various macrocell function, or other memory data. Writing into these memory cells is accomplished by turning on the proper column of pass gates within SRAM 102 via input lines 134 and 136. For example, in order to write into the first bit in the first row of SRAM 102, labeled as bit 101, the data on global lines 126 through 132 must select the first row, and input lines 134 and 136 must both be high to allow the data at LUT 100 I/O terminal 104 to access bit 101.

Another function performed by the device in the supervisor mode is facilitating the testing of the device for manufacturing and failure analysis purposes. Observability and controllability of each macrocell output is provided for by the SCAN chain architecture of the device. This provision conforms to the test standards set by the Institute of Electrical and Electronic Engineers (IEEE 1149.1 specifications), hereby incorporated by reference for all purposes.

Once configuration loading is complete during supervisor mode, the macrocell switches into the user mode where the device performs the desired logic function. In the user mode, LUT 100 works in the opposite direction, steering data from SRAM 102 out to $D_{out2}$. The signal NORMOP is asserted to tristate buffer 114 indicating normal operation. SCAN line 110 is pulled low disconnecting both feedback paths through pass gates 116 and 142. MUX 108 connects the output of buffer 106 to flip-flop 112 input and the macrocell operates as a configured logic module. The macrocell can operate in a combinatorial mode where MUX 140 selects the output of buffer 106 to be outputted at $D_{out2}$ (i.e. flip-flop 112 is bypassed), or a registered mode where MUX 140 selects $D_{out1}$ to be outputted at $D_{out2}$. The select input of MUX 140 is controlled by an architectural bit in SRAM 102.

Thus far, a look-up table based macrocell has been described that does not require additional circuitry to program its memory structure. This has been accomplished by the use of a bidirectional look-up table. This feature further enables the macrocell to provide SRAM 102 for use as a standard memory in a memory mode with the addition of only a single pass gate to facilitate direct programming. In the memory mode, to write into the memory cells SCAN line 110 is asserted. As in supervisor mode, a logic high at SCAN line 110 turns on pass gates 116 and 142, and tristates the output of MUX 140. However, this time NORMOP is also asserted to disable tristate buffer 114. This provides for direct access to the memory cells in SRAM 102 through the output $D_{out2}$ via pass gate 142 and LUT 100. Data to be written into SRAM 100 are provided through I/O pins that connect to macrocell outputs at $D_{out2}$. SRAM 100 address decoding is accomplished by LUT 100 as described above. Addresses can be either generated by on-board logic or supplied through input pins. To read data from SRAM 102 in memory mode, the macrocell is configured as in the normal user mode. SCAN line 110 turns low, NORMOP remains low, and MUX 140 provides either a registered or a direct output at $D_{out2}$.

The preferred embodiment of the present invention has thus provided a look-up table based macrocell that is capable of performing standard memory functions with the addition of minimum overhead circuitry. Only a tristate buffer 114 and two pass gates 116 and 142 have been added to the macrocell, while the need for memory address decoders have been eliminated.

In conclusion, the PLD programming circuit of the present invention reduces overhead programming circuitry to improve chip density. While the above is a complete description of the preferred embodiment of the present invention, it is possible to use various alternatives, modifications and equivalents. For example, a memory architecture other than SRAM may be employed as the configuration host. Therefore, the scope of the present invention should be determined not with reference to the above description but should, instead, be determined with reference to the appended claims, along with their full scope of equivalents.

What is claimed is:

1. A macrocell for use in reconfigurable logic array systems, comprising:
   memory means for storing programming information;
   a bidirectional look-up table coupled to the memory means and having an input/output terminal, and a plurality of select inputs; and
   means, coupled to the look-up table, for transferring the programming information via the input/output terminal of the look-up table to a selected address in the memory means in a first mode of operation, and transferring stored programming information from an address in the memory means to the input/output terminal in a second mode of operation.

2. A macrocell as recited in claim 1 wherein the bidirectional look-up table includes four select inputs to connect one of sixteen terminals to the input/output terminal.

3. A macrocell as recited in claim 2 wherein the memory means comprises sixteen rows of a plurality of serially coupled static random access memory cells, with each one of the sixteen rows being coupled to one of the sixteen terminals of the bidirectional look-up table.

4. A macrocell as recited in claim 1 wherein the transferring means comprises:
- a selection logic having a first input coupled to the look-up table input/output terminal, a second input coupled to receive the programming information, a mode select input, and an output;
- register means, having an input coupled to the selection logic output, for registering said selection logic output; and
- means, coupled to an output of the register means and controlled by the mode select input, for feeding back the register means output to the look-up table input/output terminal.

5. A macrocell as recited in claim 4 wherein the feeding back means comprises:
- driver means, coupled at the output of the register means, for driving the programming information into the look-up table; and
- a pass gate coupling an output of the driver means to the look-up table input/output terminal, and controlled by the mode select input.

6. A macrocell as recited in claim 5 wherein the driver means is tristatable.

7. A macrocell as recited in claim 4 wherein the register means is a clocked flip-flop.

8. A macrocell as recited in claim 4 further comprising:
- a buffer circuit having an input and an output, for coupling the look-up table input/output terminal at its input to the selection logic input at its output; and
- a second selection logic having a first input coupled to the register means output, a second input coupled to the buffer circuit output, and an output coupled to an output of the macrocell.

9. A macrocell as recited in claim 8 further comprising a pass gate coupling the macrocell output to the look-up table input/output terminal, and controlled by the mode selection input.

10. A macrocell as recited in claim 9 wherein the second selection logic further includes a tristate input coupled to the mode selection input.

11. A macrocell for use in reconfigurable logic array systems, comprising:
- memory means for storing programming information;
- a bidirectional look-up table coupled to the memory means and having an input/output terminal, and a plurality of select inputs;
- a selection logic having a first input coupled to the look-up table input/output terminal, a second input coupled to receive the programming information, a mode select input, and an output;
- register means, having an input coupled to the selection logic output, for registering said selection logic output; and
- means, coupled to an output of the register means and controlled by the mode select input, for feeding back the register means output to the look-up table input/output terminal.

12. A macrocell as recited in claim 11, further comprising:
- a second selection logic having a first input coupled to the register means output, a second input coupled to the look-up terminal input/output terminal, and an output coupled to an output of the macrocell;
- a buffer inserted between the look-up table input/output terminal and the first input of the selection logic; and
- a pass gate coupling the macrocell output to the look-up table input/output terminal, and controlled by the mode select input.

13. In reconfigurable array logic systems having a plurality of macrocells, with each macrocell including a look-up table coupled to a memory structure, a method for converting the macrocell to a memory unit, comprising the steps of:
- coupling an output of the macrocell to an input/output terminal of a bidirectional look-up table via a pass gate;
- selecting a memory write mode of operation by enabling the pass gate; and
- writing into the memory structure through the macrocell output, using the bidirectional look-up table as an address decoder.

14. A method for converting a macrocell into a memory unit as recited in claim 13, further comprising the steps of:
- selecting a memory read mode of operation by disabling the pass gate; and
- reading data from the memory structure using the bidirectional look-up table as an address decoder.

* * * * *

UNITED STATES PATENT AND TRADEMARK OFFICE
CERTIFICATE OF CORRECTION

PATENT NO. : 5,352,940
DATED : October 4, 1994
INVENTOR(S) : James Watson

It is certified that error appears in the above-indentified patent and that said Letters Patent is hereby corrected as shown below:

On the cover page, at [56] under the References Cited, please add the following reference:

"<u>Optimized Reconfigurable Cell Array (ORCA) Series Field-Programmable Gate Arrays</u>," AT&T Microelectronics Advance Data Sheet, February, 1993, Signed and Sealed this Fourteenth Day of March, 1995

Attest:

BRUCE LEHMAN

Attesting Officer     Commissioner of Patents and Trademarks